United States Patent [19]

Bernstein

[11] Patent Number: 4,973,906
[45] Date of Patent: Nov. 27, 1990

[54] FLOW COMPENSATED NMR FAST PULSE SEQUENCE

[75] Inventor: Matthew A. Bernstein, Waukesha, Wis.

[73] Assignee: General Electric Company, Milwaukee, Wis.

[21] Appl. No.: 395,001

[22] Filed: Aug. 17, 1989

[51] Int. Cl.⁵ ............................................. G01R 33/20
[52] U.S. Cl. .................................... 324/309; 324/306
[58] Field of Search ............... 324/300, 306, 307, 309, 324/311, 312, 313, 314; 128/653 AF

[56] References Cited

U.S. PATENT DOCUMENTS

| | | | |
|---|---|---|---|
| 3,975,675 | 8/1976 | Danand et al. | 324/312 |
| 4,639,671 | 1/1987 | Macouski | 324/309 |
| 4,656,424 | 4/1987 | Tsur et al. | 324/309 |
| 4,665,365 | 5/1987 | Glover et al. | 324/309 |
| 4,714,081 | 12/1987 | Damoulin et al. | 128/653 AF |
| 4,731,583 | 3/1988 | Glover et al. | 324/309 |
| 4,796,635 | 1/1989 | Damoulin | 128/653 AF |
| 4,800,889 | 1/1989 | Damoulin et al. | 128/653 AF |
| 4,812,760 | 3/1989 | Bottomley | 324/309 |
| 4,849,697 | 7/1989 | Cline et al. | 324/306 |
| 4,896,113 | 1/1990 | Pelc | 324/309 |
| 4,918,386 | 4/1990 | Damoalin | 324/309 |

OTHER PUBLICATIONS

"An Overview of NMR Fast Scanning Techniques", Hawkes, R. C. and Patz, S., "Rapid Fourier Imaging Using Steady-State Precession", Mar. 7, 1986.
"Book of Abstracts—Society of Magnetic Resonance in Medicine" Sixth Annual Meeting, Aug. 17-21, 1987, vol. 1.
Perman, et al., "Theoretical and Experimental Comparison of Velocity Compensated CeFast and Grass SSFP Pulse Sequences" presented at RSNA, 1987.

Primary Examiner—Michael J. Tokar
Attorney, Agent, or Firm—Quarles & Brady

[57] ABSTRACT

A steady-state free precession fast NMR pulse sequence includes a readout gradient waveform which refocuses the transverse magnetization to produce an S− NMR signal during the subsequent pulse sequence. This readout gradient waveform is shaped to null the gradient first moment and to thereby suppress flow and motion artifacts. In an alternative embodiment, crusher pulses employed in the phase encoding or slice select gradients are also flow compensated.

8 Claims, 7 Drawing Sheets

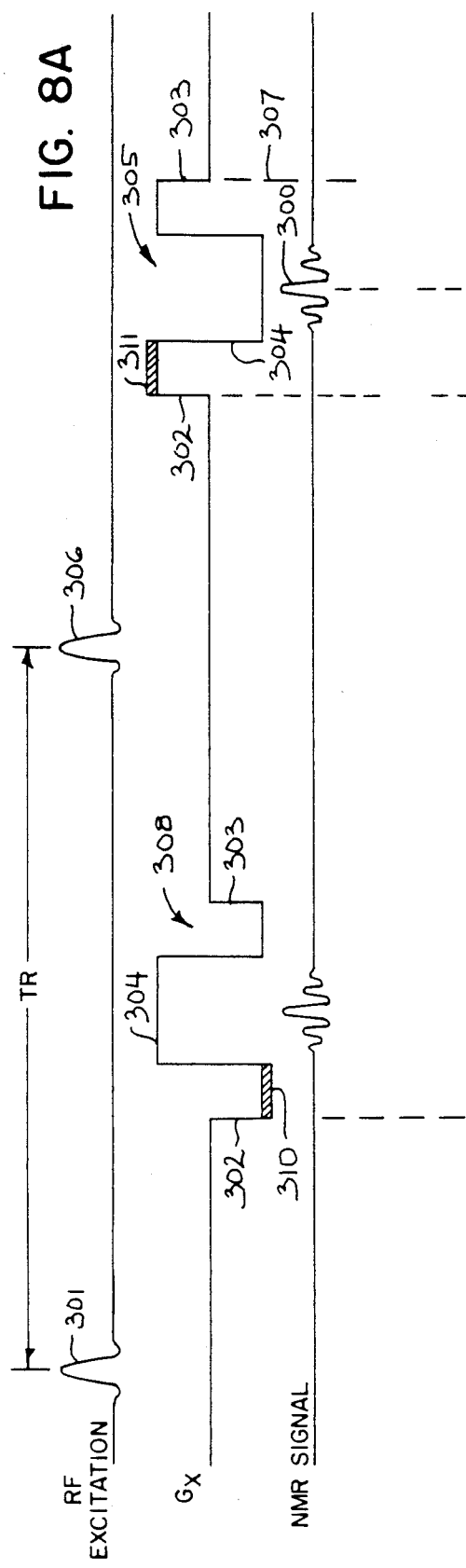
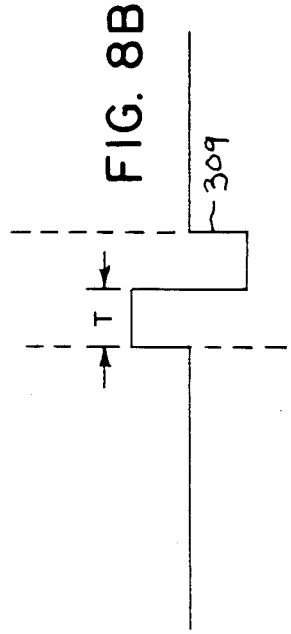
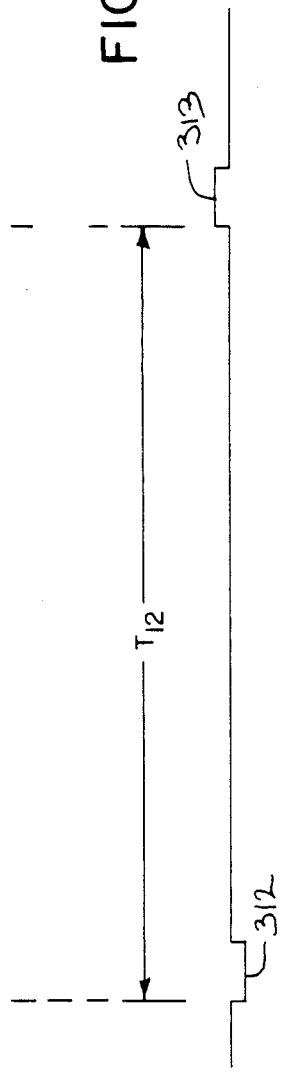

4,973,906

FLOW COMPENSATED NMR FAST PULSE SEQUENCE

BACKGROUND OF THE INVENTION

The field of the invention is nuclear magnetic resonance (NMR) imaging and, particularly, fast imaging using steadystate free precession pulse sequences.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the z-y plane to produce a net transverse magnetic moment $M_1$, which is rotating, or spinning, in the x-y plane at the Larmor frequency. The degree to which the net magnetic moment $M_z$ is tipped, and hence, the magnitude of the net transverse magnetic moment $M_1$ depends primarily on the length of time and magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins dephase after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or, preferably, a spin-echo signal.

Most NMR scans currently used to produce medical images require many minutes to acquire the necessary data. The reduction of this scan time is an important consideration, since reduced scan time increases patient throughput, improves patient comfort, and improves image quality by reducing motion artifacts. The present invention relates to a class of pulse sequences which have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques and they are characterized by a cyclic pattern of transverse magnetization in which the resulting NMR signal refocuses at each RF excitation pulse to produce an echo signal. This echo signal includes a first part S+ that is produced after each RF excitation pulse and a second part S− which forms just prior to the RF excitation pulse.

There are two well known SSFP pulse sequences used to produce images. The first is called gradient refocused acquired steady-state (GRASS) and it utilizes a readout gradient $G_x$ to shift the peak in the S+ signal that is produced after each RF excitation pulse toward the center of the pulse sequence. This pulse sequence is shown in FIG. 1 where the NMR signal is an S+ gradient echo that is induced by the readout gradient $G_x$. In two-dimensional imaging, a slice selection gradient pulse is produced by the gradient $G_z$ and is immediately refocused in the well-known manner. A phase encoding gradient pulse $G_y$ is produced shortly thereafter to position encode the acquired NMR data, and to preserve the steady-state equilibrium, the effects of the phase encoding gradient pulse are nullified by a corresponding $G_y$ rewinder gradient pulse after the NMR signal has been acquired and before the next pulse sequence begins as described in U.S. Pat. No. 4,665,365.

The second well known SSFP pulse sequence is called contrast enhanced fast imaging (SSFP-ECHO) and it utilizes the S— signal that is produced just prior to each RF excitation pulse. This pulse sequence is shown in FIG. 2 where the NMR signal is an S— echo signal caused by the gradient refocusing of the transverse magnetization which would otherwise refocus at the next RF excitation pulse. To accomplish this, the readout gradient $G_x$ is substantially different in this pulse sequence and includes a positive pulse prior to the actual readout pulse and a negative pulse after the readout pulse. The former pulse dephases the FID signal (S+) which might otherwise be produced during the data acquisition window, and the latter pulse causes the transverse magnetization to rephase during the next pulse sequence to produce the echo signal S—. For a more detailed discussion of the SSFP-ECHO pulse sequence, reference is made to an article by R. C. Hawkes and S. Patz entitled "Rapid Fourier Imaging Using Steady-State Free Precession", published in *Magnetic Resonance In Medicine* 4, pp. 9–23 (1987).

In addition to being a very short pulse sequence which enables a complete scan to be carried out in a few seconds, the SSFP-ECHO sequence has an attribute which makes it more useful than the GRASS pulse sequence in many medical applications. More specifically, the S+ signal acquired with the GRASS pulse sequence has an amplitude which is approximately a function of the ratio $T_2/T_1$, while the S— signal acquired by the SSFP-ECHO pulse sequence has additional $T_2$ dependence. As a result, SSFP-ECHO is a $T_2$ weighted pulse sequence which provides better contrast between tissues of differing $T_2$. Since $T_2$ is a good indicator of diseased tissues, the SSFP-ECHO pulse sequence provides better contrast between normal tissues and diseased tissues in the reconstructed image Unfortunately, the SSFP-ECHO pulse sequence also is more susceptible to distortions, or artifacts, which are produced in the reconstructed image as a result of moving spins. For example, blood flow in the direction of the readout gradient is incorrectly position encoded, and the signals produced by the flowing spins are thus positioned incorrectly in the reconstructed image. This increased sensitivity to motion and flow artifacts is due to the fact that the S— signal is produced by transverse magnetization which is created by RF excitation pulses generated during previous pulse sequences. Over the extended time ($\geq 2TR$) between excitation and readout, the gradient fields produce large dipolar moments which sensitize the S— signal to flow and motion.

SUMMARY OF THE INVENTION

The present invention relates to the compensation of the gradient fields and the phase cycling of the RF excitation pulses used to produce a steady-state free precession fast NMR pulse sequence which suppresses motion and flow artifacts in the reconstructed image. More specifically, the present invention is an NMR pulse sequence in which the readout gradient has a trailing negative lobe which cooperates with the readout gradient in the subsequent pulse sequence to refocus the S— NMR signal and a leading negative lobe which functions to compensate the readout gradient such that the sensitivity of the resulting S— NMR signal to flow in the direction of the readout gradient is substantially reduced. In another aspect of the invention, the magnitude of the S+ NMR signal produced during the readout gradient is reduced by the application of a crusher gradient pulse in the slice select or the phase encoding direction, prior to the readout gradient, and the crusher gradient pulse is flow compensated by corresponding dipolar gradient pulses produced after the readout gradient. In yet another aspect of the present invention, interference in the reconstructed image caused by the S+ NMR signal is substantially reduced by alternating the phase of the RF excitation pulses during the scan in a preselected pattern. The pattern can be selected to reduce the magnitude of the acquired S+ NMR signal relative to the magnitude of the acquired S— NMR signal, or the phase of the S+ NMR signal can be altered such that the image reconstructed from the S+ NMR signal is shifted along the phase encoding direction from the image reconstructed from the S— NMR signal.

A general object of the invention is to flow compensate the readout gradient in a steady-state free precession fast NMR pulse sequence. The shape of the readout gradient waveform is such that it not only refocuses the S— signal, but its first moment, as measured between successive NMR signals produced during successive pulse sequences, is substantially reduced.

Another object of the invention is to flow compensate the crusher pulses used in the phase encoding gradient direction or slice select gradient direction. This is accomplished by adding a dipolar gradient waveform to the pulse sequence following the acquisition of the S— NMR signal.

Yet another object of the invention is to reduce the size of the crusher pulses used to dephase the S+ signal, by reducing the magnitude of the S+ signal or shifting its phase such that it does not interfere with the image reconstructed from the S— signal. This is accomplished by alternating the phase of the RF excitation pulses in a predetermined pattern.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIGS. 8A, 8B, and 8C are graphic representations showing how the pulse sequence of FIGS. 5–7 are flow compensated.

DESCRIPTION OF THE PREFERRED EMBODIMENT

Figure 1:
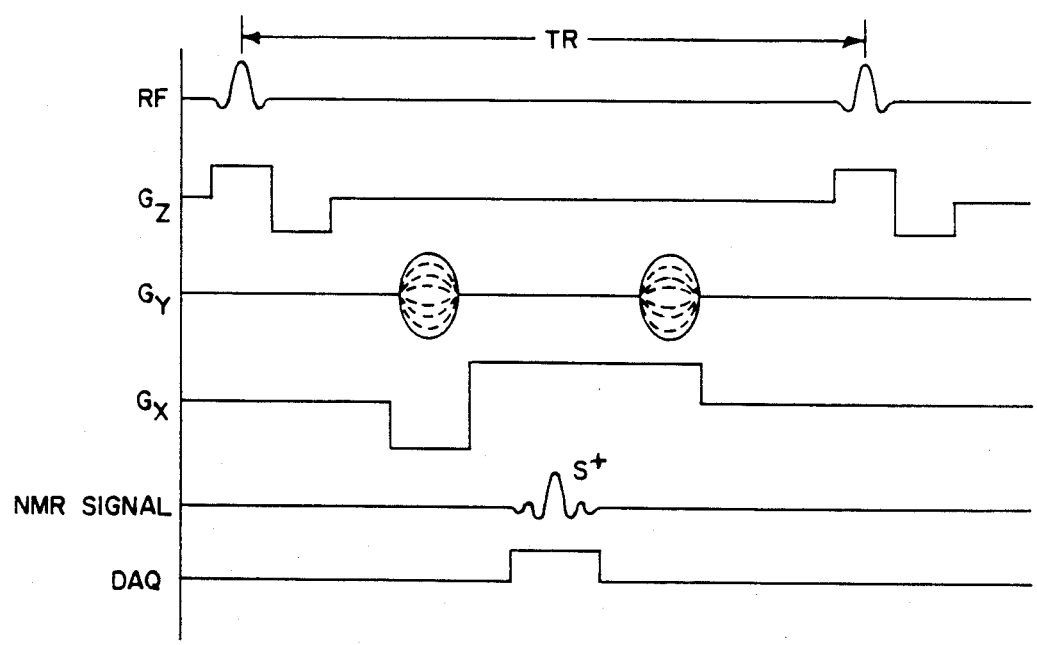
FIG. 1 is an NMR pulse sequence known in the art as GRASS.
Figure 2:
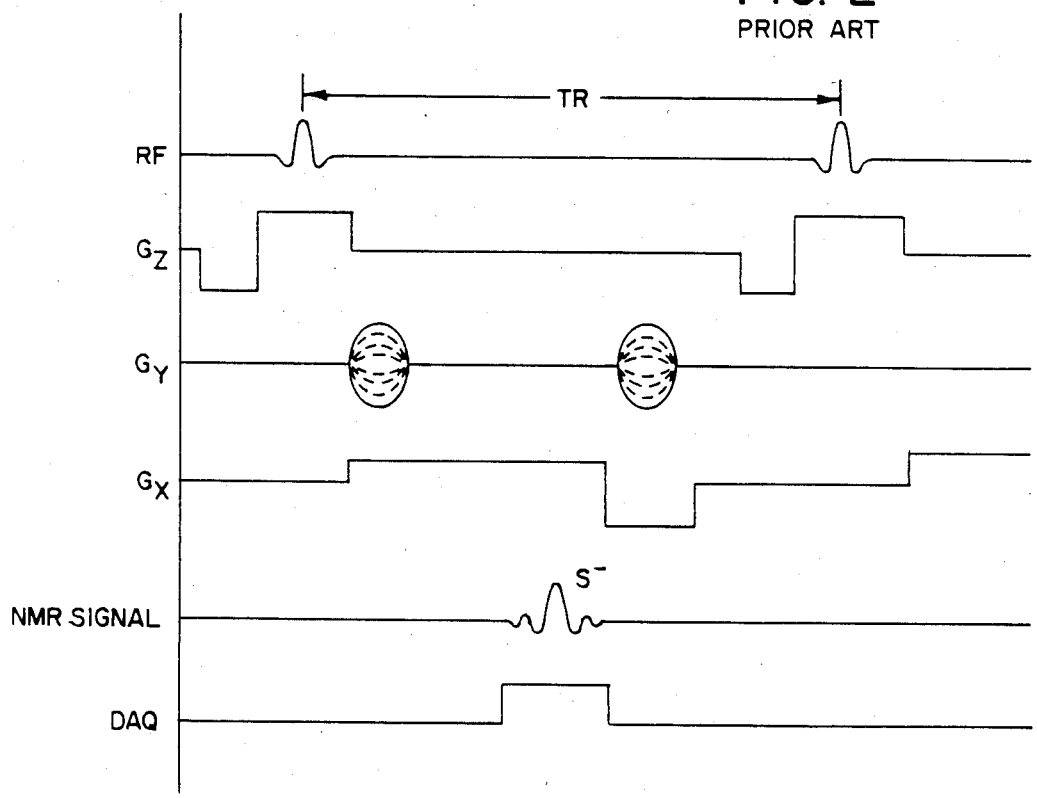
FIG. 2 is an NMR pulse sequence known in the art as SSFP-ECHO or CEFAST.
Figure 3:
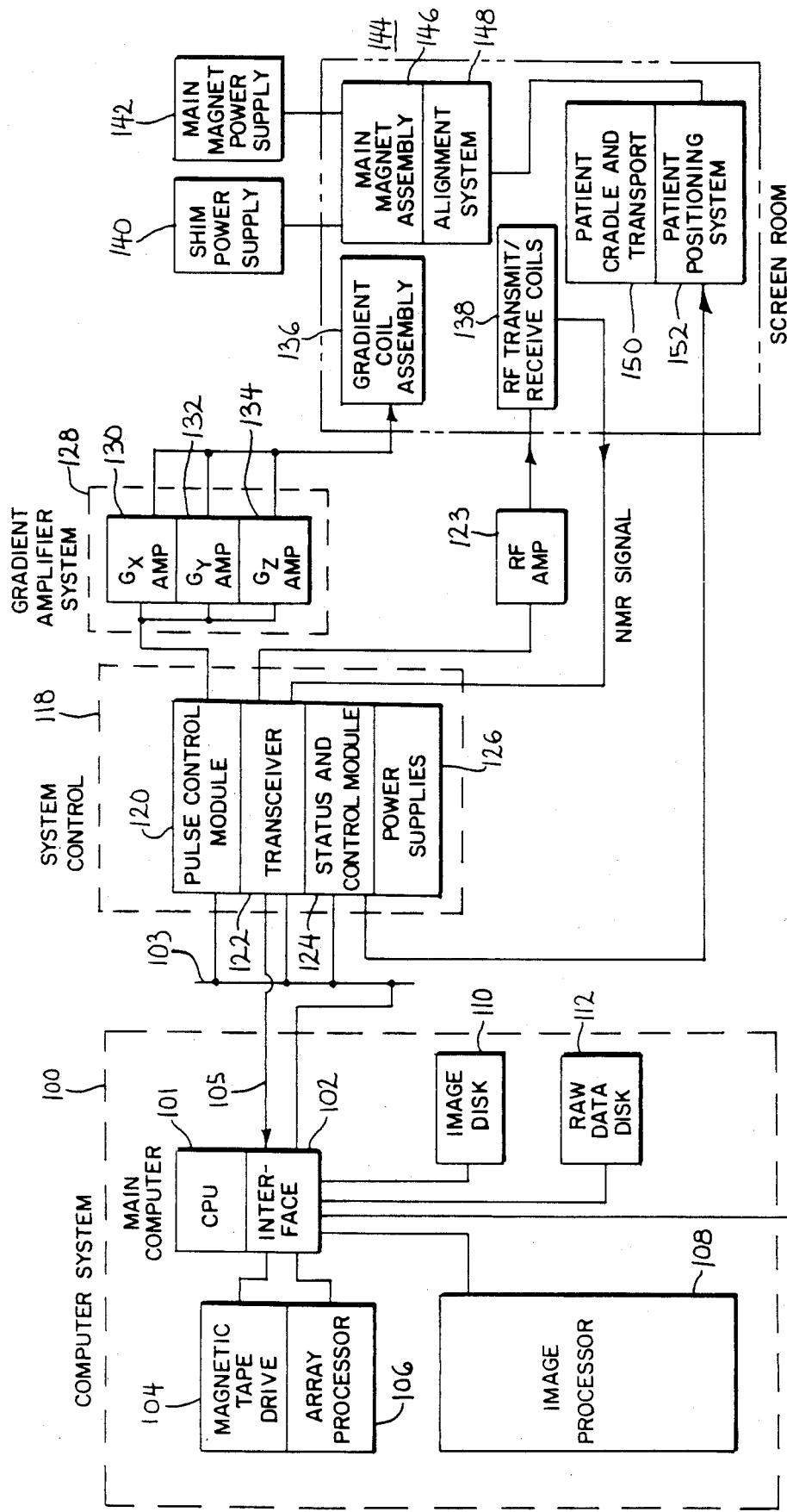
FIG. 3 is a block diagram of an NMR system which employs the present invention.

Referring first to FIG. 3, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV4000). The computer has associated therewith an interface 102 through which a plurality of computer peripheral devices and other NMR system components are coupled. Along the computer peripheral devices is a magnetic tape drive 104 which may be utilized under the direction of the main computer for archiving patient data and images to tape. Processed patient data may also be stored in an image disc storage device designated 110. An array processor 106 is utilized for preprocessing data and for image reconstruction. The function of image processor 108 is to provide interactive image display manipulation such as magnification, image comparison, gray-scale adjustment and realtime data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system exercises control over the NMR system by means of system control 118 and gradient amplifier system 128. The computer 100 communicates with system control 118 by means of a serial digital communication network 103 (such as the Ethernet network) in a manner well known to those skilled in the art. The system control 118 includes several subsystems such as the pulse control module (PCM) 120, a radio frequency transceiver 122, a status control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136 and which is part of a magnet assembly 146. When energized, the gradient coils generate magnetic field gradients $G_x$, $G_y$ and $G_z$ of the magnetic field in the same direction as the main polarizing magnetic field. The gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform module in accordance with the control signals to an RF power amplifier 123 which then energizes RF coils 138 which are situated within main magnet assembly 146. The NMR signals radiated by the excited nuclei in the patient are sensed by the same or a different RF coil than issued for transmitting. The signals are detected, amplified, demodulated, filtered, and digitized in the receiver section of the transceiver 122. The processed signals are transmitted to the main computer 101 for processing by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as an Intel 8086) for processing commands from the main computer 101. The SCM 124 includes means for acquiring information regarding patient cradle position, and the position of the movable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply 140 is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the main magnet power supply 142 is utilized to bring the polarizing field produced by the magnet to the proper operating strength and is then disconnected. In the case of a permanent magnet, power supply 142 would not be needed.

The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room. A bi-directional attenuation of approximately 100 db. is typical in the 63 MHz to 64 MHz frequency range of operation.

Figure 4:
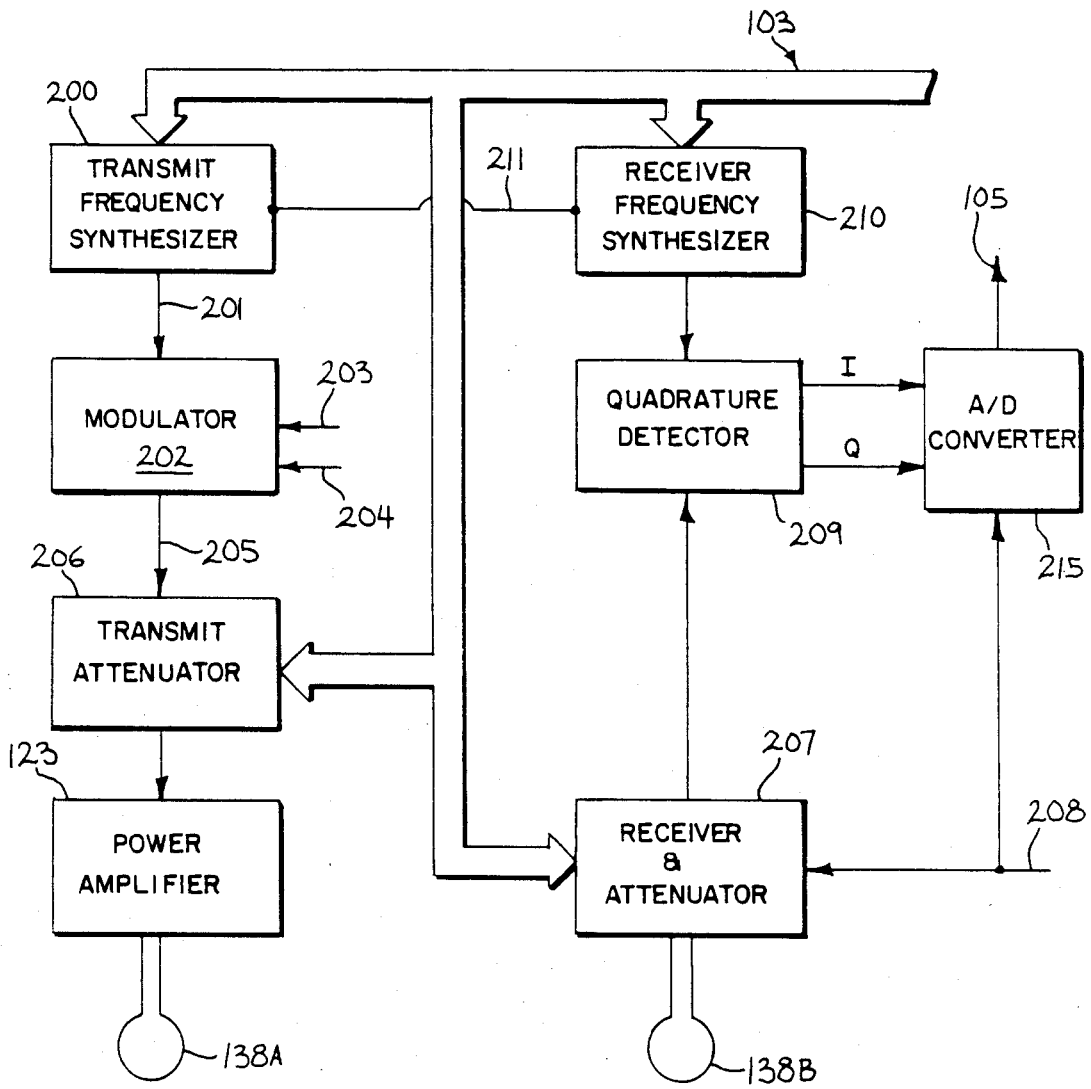
FIG. 4 is an electrical block diagram of the transceiver which forms part of the NMR system of FIG. 3.

Referring particularly to FIGS. 3 and 4, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals (CF) through the communications link 103 from the main computer 101. These digital signals indicate the frequency which is to be produced at an output 201 at a resolution of one Hertz. The commanded RF carrier is applied to a modulator 202 where it is frequency and amplitude modulated in response to signals received through line 203, and the resulting RF excitation signal is turned on and off in response to a control signal from the PCM 120 received through line 204. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A.

Referring still to FIGS. 3 and 4, the NMR signal produced by the subject is picked up by the receiver coil 138B and applied to the input of a receiver 207. The receiver 207 amplifies the NMR signal and this is then attenuated by an amount determined by a digital attenuation signal (RA) received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through filters to a pair of analog-to-digital converters indicated collectively at 215. These A/D converters are enabled by the control line 208 to produce digitized NMR data only when a valid signal is present. This data is output to the main computer 101 through line 105. The filters at the inputs to the A/D converters are controlled by the main computer 101 to limit the bandwidth of I and Q. The quadrature detector 209 also receives an RF reference signal from a second frequency synthesizer 210 and this is employed by the quadrature detector 209 to sense the amplitude of that component of the NMR signal which is in phase with the transmitter RF carrier and the amplitude of that component of the NMR signal which is in quadrature therewith. The frequency synthesizer 210 receives digital signals (CF) through the link 103 which determine the frequency of the demodulation signal. The phase of the two synthesizers 200 and 210 is locked together through a line 211, and in most measurements, the frequency of the two synthesizers is the same.

The present invention is implemented as a fast pulse sequence which is controlled by the main computer 101. This fast pulse sequence is executed repeatedly during a scan to acquire the NMR data necessary to reconstruct an image. This fast pulse sequence will now be described with reference to FIGS. 5–7 which illustrate three different preferred embodiments.

Figure 5:
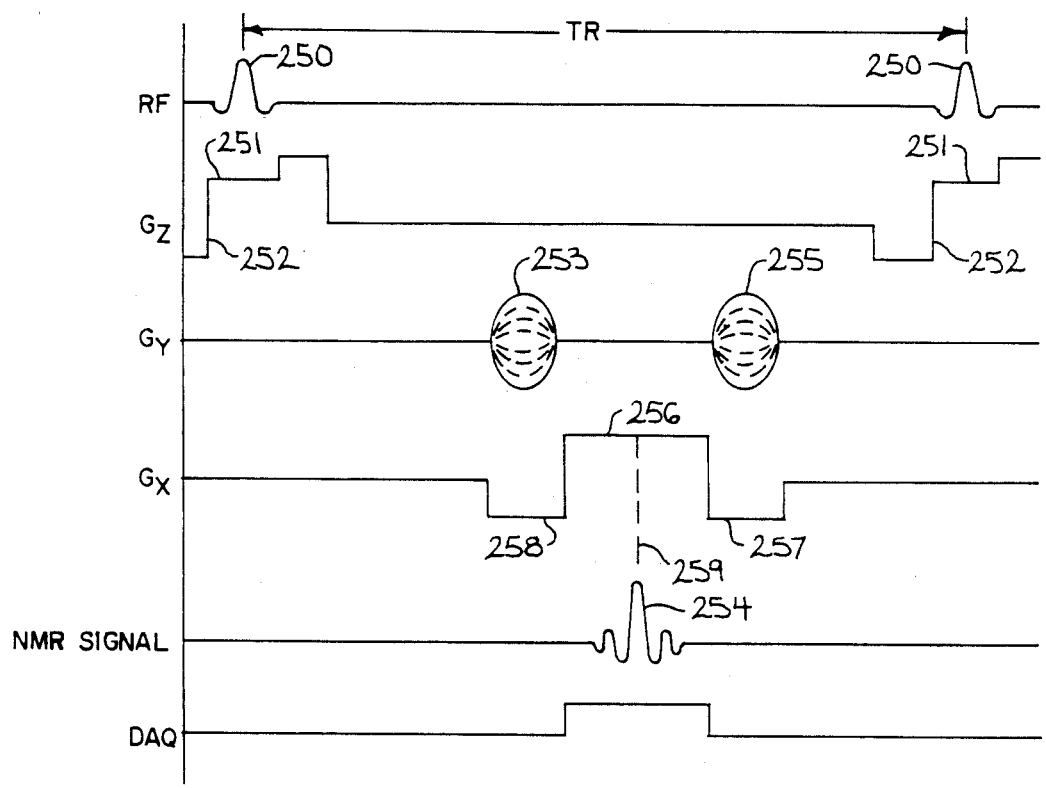
FIG. 5 is a graphic representation of a first preferred embodiment of a pulse sequence which practices the present invention with a 2DFT image reconstruction.

Referring particularly to FIG. 5, the fast pulse sequence is characterized by a series of RF excitation pulses 250 which have a magnitude and duration sufficient to tip the net magnetization by an angle of less than 90°. In the preferred embodiment a tip angle of from 10° to 90° is employed depending on the contrast which is desired in the reconstructed image. The RF excitation pulses 250 are spaced apart by a very short repetition time (TR) typically in the range of 20 to 50 milliseconds. This repetition time is less than the spin-spin relaxation time $T_2$ of water and tissue and a steady-state equilibrium is established after a few pulses in which the transverse magnetization cycles between a maximum, a minimum and back to a maximum during each interval TR. Even though the RF excitation pulse 250 generally has a flip angle which is much less than 180°, it does reverse the phase accumulation of the magnetization in the same manner as a 180° RF pulse. The efficiency with which the phase accumulation is reversed is a function of the flip angle ($\alpha$):

$$\sin^2(\alpha/2),$$

which is nonzero for $0 < \alpha < 90°$. Complete reversal efficiency is reached when $\alpha = 180°$. As will be explained in more detail below, the significance of this phase accumulation reversal is that the cumulative effect of applied magnetic field gradients is also reversed.

The pulse sequence of FIG. 5 is employed with a 2DFT image reconstruction technique and it uses the z axis magnetic field gradient $G_z$ to select a slice of spins for the measurement. More specifically, the RF excitation pulses 250 are selective, and a $G_z$ gradient pulse 251 is produced at the same time to excite spins in the desired slice. The $G_z$ gradient is then increased to deliberately dephase both stationary and moving spins, and to thereby suppress the S+ NMR signal that is otherwise produced after each RF excitation pulse 250. A $G_z$ gradient rephasing pulse 252 is produced just prior to each slice select pulse 251 to rephase the spin prior to the subsequent readout of the S− NMR signal.

Position along the Y axis is phase encoded into the S− NMR signal by a $G_y$ phase encoding gradient pulse 255. This phase encoding occurs before the S− NMR signal 254 is acquired during the subsequent pulse sequence, and a second $G_y$ pulse 255 rewinds, or rephases, the spins to maintain equilibrium. The amplitude of these phase encoding pulses 253 and 255 are equal to each other, but they are changed from view-to-view to acquire NMR data for a complete scan.

Positioned between these phase encoding gradient pulses 253 and 255 is a readout gradient pulse 256 which is applied as the S− NMR signal 254 is acquired. This readout gradient pulse 256 refocuses the S− NMR signal and it frequency encodes the acquired data in the well known manner. In addition, a negative $G_x$ gradient pulse 257 is produced after the readout pulse 256 to dephase the spins and set up the production of the S− NMR signal 254 during the next pulse sequence. An important feature of the pulse sequence of FIG. 5 is a negative $G_x$ gradient pulse 258 just prior to the readout gradient pulse 256. This pulse 258 is substantially the same as pulse 257 so that the entire $G_x$ gradient pulse waveform is substantially symmetric about the axis indicated by dashed line 259. In fact, as will be described in more detail below, the $G_x$ pulse 258 is slightly larger than the $G_x$ pulse 257 to maximize the suppression of flow artifacts.

Figure 6:
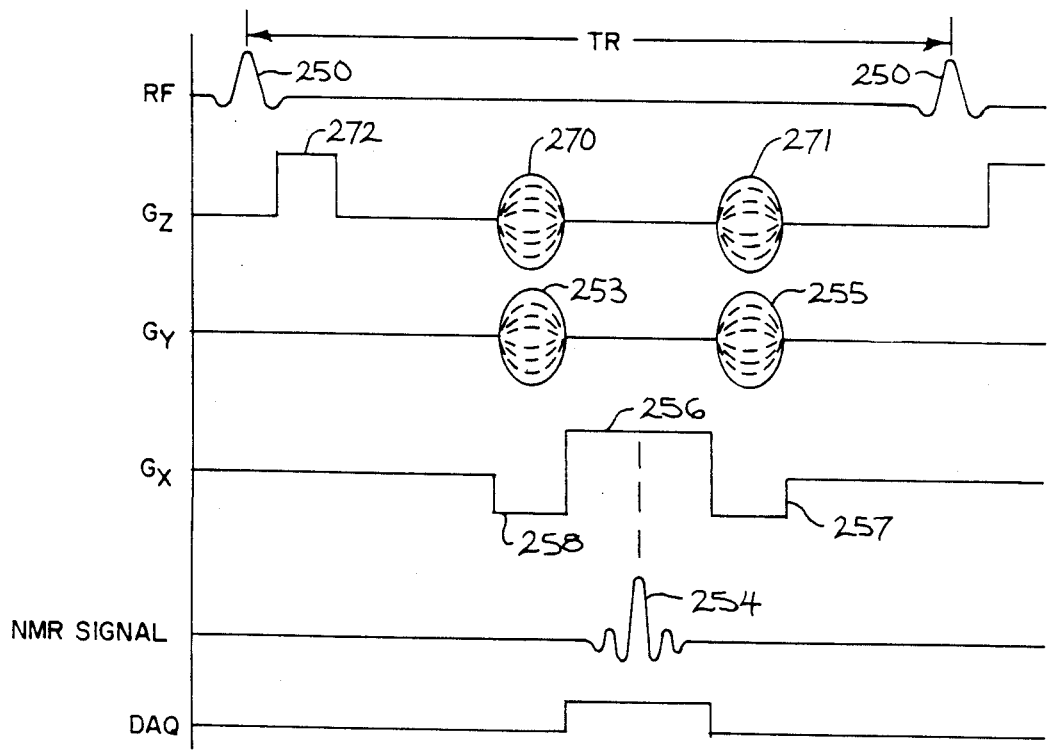
FIG. 6 is a graphic representation of the first preferred embodiment of the pulse sequence which practices the present invention with a 3DFT image reconstruction.

The pulse sequence of FIG. 6 is substantially the same as that of FIG. 5, except that it is employed with a 3DFT reconstruction method. The difference between the pulse sequences used for 2DFT and 3DFT reconstruction methods lies in the $G_z$ magnetic field gradient pulses. A nonselective 3DFT sequence is shown in which no $G_z$ gradient pulse is applied concurrently with the RF excitation pulse 250. A $G_z$ phase encoding pulse 271 and a rewinder pulse 270 are produced adjacent the acquisition of the NMR signal 254. In addition, a dephasing pulse 272 is produced immediately after the RF excitation pulse 250 to dephase the spins and thereby suppress production of the S+ signal during the subsequent data acquisition. The $G_y$ and $G_z$ phase encoding gradient pulses are stepped through their appropriate imaging values and the NMR signals 254 are acquired, digitized and processed in the well known manner. In a modified version of the 3DFT pulse sequence of FIG. 6, a weak $G_z$ gradient pulse may be applied concurrently with the RF excitation pulse 250 to reduce the effects of wraparound, or aliasing, in the slice directional. When such a "slab selective" 3DFT pulse sequence is employed, a small $G_z$ rephasing gradient is added to the second $G_z$ gradient pulse 271.

In contrast to a normal $T_2$ weighted NMR scan which typically requires from 5 to 15 minutes to acquire data for a set of 256 by 256 pixel images, a scan using the method of FIG. 6 may require from 2 to 4 minutes. This time reduction results from the much shorter pulse repetition times (TR) of from 20 to 50 milliseconds rather than the usual repetition times which are greater than the spin-spin relaxation constant ($T_2$) of tissue (40 to 200 milliseconds).

As indicated in U.S. Pat. No. 4,731,583 entitled "Methods For Reduction of MR Image Artifacts Due To Flowing Nuclei By Gradient Moment Nulling", it is well known that conventional pulse sequences can be compensated to reduce flow artifacts by properly shaping their gradient fields This is accomplished by making the higher order moments (1 and greater) of the gradient waveforms between the RF excitation pulse and the acquired NMR signal equal to zero. This strategy must be modified for SSFP-ECHO pulse sequences, however, because the S− NMR signal is generated by transverse magnetization produced by previous RF excitation pulses rather than the RF excitation pulse in the same sequence.

The present invention compensates for flow by changing the gradient pulses such that their first order moment as measured between an RF excitation pulse in a previous pulse sequence and the S− NMR signal acquired in the current pulse sequence is substantially reduced. This is accomplished in the pulse sequences of FIGS. 5 and 6 with respect to the readout gradient $G_x$.

This is shown best in FIG. 8A where the NMR signal 300 is produced by transverse magnetization created by the RF excitation pulse 301 in the previous pulse sequence and earlier RF excitation pulses. The $G_x$ readout pulse 308 in the previous pulse sequence has two negative lobes 302 and 303, each having an equal area "A", separated by a positive lobe 304 having an area 2A. As is well known in the art, this −1, +2, −1 $G_x$ gradient waveform has a zero first moment, which means that it will not impart a phase shift to spin moving at a constant velocity. The $G_x$ readout pulse 305 in the current pulse sequence is identically shaped, but its polarity is reversed to reflect the fact that the phase accumulation of the transverse magnetization is reversed by the intervening RF excitation pulse 306. If the NMR signal were acquired at the end of the gradient pulse 303, as indicated at dashed line 307, the first moment of the waveforms 308 and 305 is zero. As a result, motion and flow artifacts would be suppressed. Of course, this is not the case, and because the NMR signal 300 is acquired at the midpoint of the gradient waveform 305, the gradient dipole created by the first half of the waveform 305 is not offset by the gradient dipole of the opposite polarity which occurs during the second half of the waveform 305. Moving spins are thus dephased by an amount proportional to their velocity along the readout axis and this produces motion artifacts in the reconstructed image.

The uncompensated gradient dipole is illustrated in FIG. 8B at 309, and it is a further teaching of the present invention that the gradient waveforms 308 and 305 can be altered slightly to offset, or null, its effect. More specifically, the leading lobe 302 on the gradient waveforms 308 and 305 may be increased slightly in magnitude (i.e. either width or amplitude) as shown in FIG. 8A by the cross hatched areas 310 and 311 to create an additional gradient dipole indicated separately in FIG. 8C by the pulses 312 and 313. The area of each additional amount 310 and 311 is substantially less than the area of each lobe of the dipole 309 to be compensated, because of the long moment arm $T_{12}$ between the two parts 312 and 313 of the resulting COmpensating dipole. This is in contrast to the short moment arm T on the gradient dipole 309 which is to be compensated.

$$T \times A_1 = T_{12} \times A_2$$

$$A_2 = T \times A_1 / T_{12} \tag{1}$$

where:
$A_2$ is the area added to the lobe 302 to fully compensate for flow;
$A_1$ is the area of the lobe 302;
$T_{12}$ is the time period between the start of each gradient pulse waveform; and
T is the width of the gradient waveform lobe 302.

Since the NMR signal 300 is actually produced by transverse magnetization from many previous RF excitation pulses, not just the pulse 301, the moment arm on the compensation lobes 312 and 313 is actually much longer than $T_{12}$. The optimal value for $T_{12}$ was found by experimentation to be twice the pulse repetition time TR. In other words, the best flow compensation was achieved when the area added to the lObe 302 on the gradient waveform is one-half that indicated above by equation (1).

While the first lobe 302 serves to flow compensate the readout gradient $G_x$, it also creates a problem which must be solved. More specifically, the negative gradient pulse 302 operates in combination with the first half of the gradient pulse 304 to refocus and produce an S+ NMR signal that interferes with the S− NMR signal. Unless measures are taken to deal with this problem, interference rings can be produced in the reconstructed image.

Figure 7:
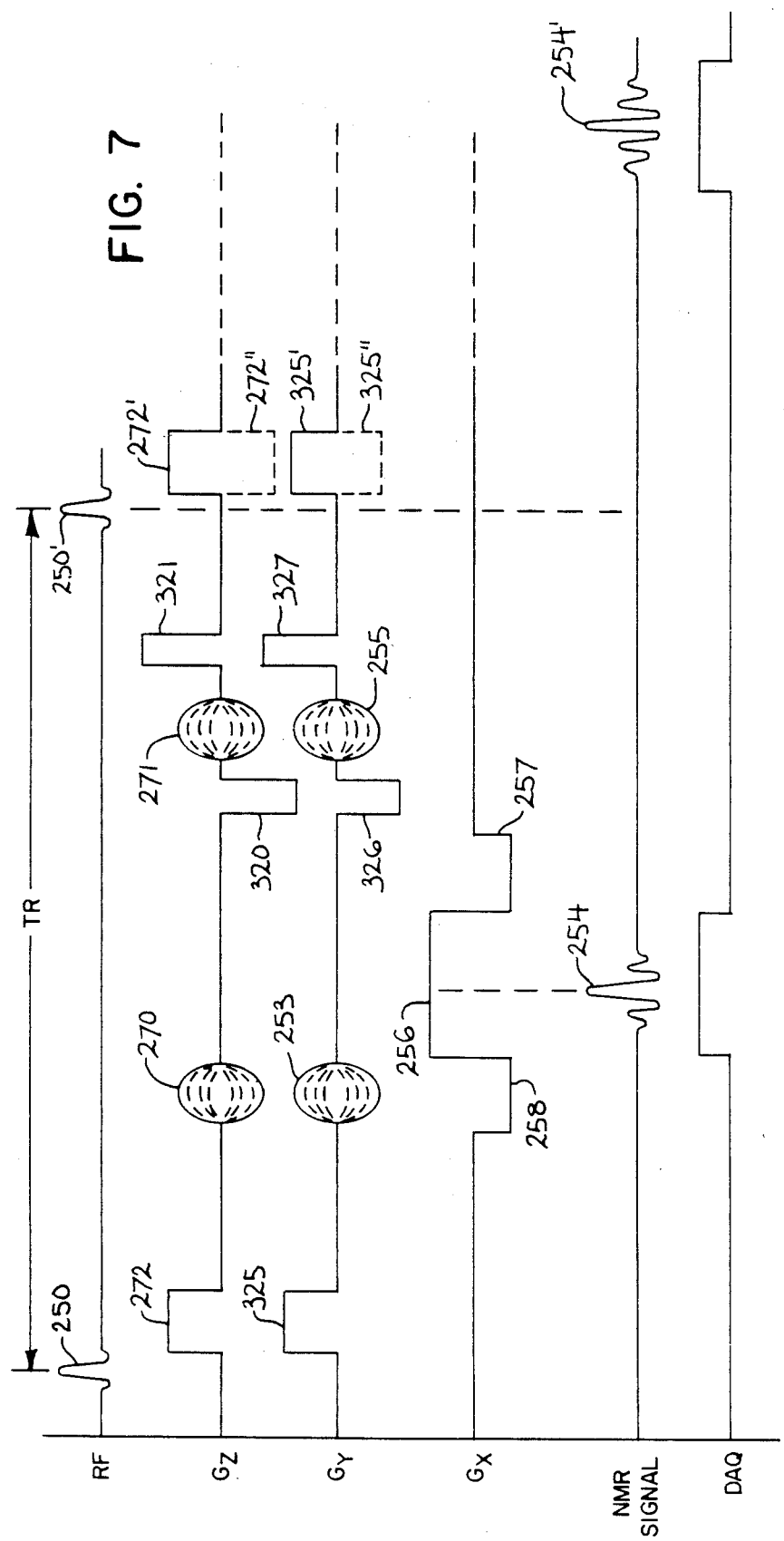
FIG. 7 is a graphic representation of a second preferred embodiment of a pulse sequence which practices the present invention with a 3DFT image reconstruction.

As indicated above with respect to the pulse sequence of FIG. 6, to suppress the S+ NMR signal so that it does not interfere with the acquisition of the S− NMR signal 254, a $G_z$ "crusher" gradient pulse 272 is produced immediately after the RF excitation pulse 250. While this serves to suppress the S+ NMR signal, it can, in turn, create sensitivity to flow or motion artifacts. That is, if there is significant motion or flow in the direction of this gradient, motion artifacts can be produced in the reconstructed image. The reason for this is illustrated in FIG. 7, where the $G_z$ crusher pulse 272 is shown in a first pulse sequence and the same pulse 272′ is shown in the next pulse sequence As indicated above, the phase accumulation reverses direction when the second RF excitation pulse 250′ is produced, and as a result, the sense of the crusher pulse 272′ is actually reversed as indicated by dashed line 272″. With respect to the NMR signal 254′, therefore, the $G_z$ crusher pulses 272 and 272″ create a large dipole moment which sensitizes to spin velocity along the z axis.

To compensate for the $G_z$ crusher pulse 272, a pair of $G_z$ pulses 320 and 321 are produced after the acquisition of NMR signal 254.

These pulses 320 and 321 have opposite polarity and they form a dipole which has a first moment that is equal to, but opposite in sign to the first moment formed by the $G_z$ crusher pulses 272 and 272″. As a result, the first moment of the $G_z$ gradient pulses as measured between the RF excitation pulse 250 and the acquisition of the S− NMR signal 254′ is substantially zero, and the signal 254′ is substantially desensitized to constant flow or motion along the z dimension.

The S+ NMR signal can also be suppressed by employing a $G_y$ gradient crusher pulse 325. In such case, $G_y$ compensation pulses 326 and 327 are produced after the acquisition of the NMR signal 254. These motion and flow compensation pulses 326 and 327 operate in the same manner as the $G_z$ pulses 320 and 321 to null the first moment of the $G_y$ gradients.

It should be apparent that in order to flow compensate the $G_z$ or $G_y$ crusher pulses 272 or 325, the amplitude of the dipolar pulses 320/321 or 326/327 must be very large. This is because the moment arm (TR) on the crusher pulses is much longer than the moment arm on the compensating dipolar pulses, and this difference must be offset by increasing the amplitude of the dipolar compensating pulses. There are practical limits on the amplitude of the dipolar compensating pulses that can be produced by the NMR scanner system and, hence, there are limits on the magnitude of the $G_z$ or $G_y$ crusher pulses which can be used to suppress the S+ NMR signal during the data acquisition period.

Recognizing this limitation, the present invention also includes a method for reducing the interference between the undesired S+ NMR signal and the desired S− NMR signal. In one method, which will now be described, the S+ NMR signal is reduced relative to the S− NMR signal, and in a second method, which will be described below, the phase of the S+ NMR signal is shifted relative to that of the S− NMR signal such that separate images are constructed. It is contemplated that these methods will be used in combination with reasonable sized crusher pulses to produce the best possible images using the flow compensated SSFP-ECHO pulse sequence of the present invention.

In order to set up a steady-state free precision (SSFP), the RF excitation pulses must be phase coherent. Two methods have been used in the past to achieve this. In one prior method, the polarity and phase of all the RF excitation pulses are the same, that is, are referenced to a common axis in the rotating frame. Such a method is represented schematically as follows:

$$\ldots +++++++++++++++ \ldots \qquad (1)$$

A second known method is to alternate the polarity (i.e. 180° phase shift) of the RF excitation pulses as follows:

$$\ldots +-+-+-+-+-+-+ \ldots \qquad (2)$$

The amplitudes of the S+ and S− NMR signals are the same when either of these two methods is used, although the polarity of the NMR signals alternates with method (2) and this fact must be taken into account by reversing the sign of alternate acquired views.

The magnitude of the S+ NMR signal can be suppressed relative to the S− NMR signal by using a different phase pattern as follows:

$$\begin{array}{l}\ldots\\++--++--++--++--++--\\++\ldots\end{array} \qquad (3)$$

The data acquisition and image reconstruction is performed in the same manner as method (2), however, the polarity, or phase, of the RF excitation pulses is reversed every two pulses rather than every one. This method cancels the "odd" contributions to the steady-state S+ and S− NMR signals, and the effect is to reduce the magnitude of the S+ NMR signal more than the S− NMR signal. The disadvantage, of course, is that the S− NMR signal is reduced with a consequent loss of signal-to-noise ratio which may be unacceptable in many applications.

When either of the patterns indicated in (2) or (3) is used, the sudden change in RF excitation field phase tends to destroy the steady-state equilibrium of the magnetization. To prevent this from occurring, the order in which the views acquired is changed so that all views of one phase are acquired and then all views of the opposite phase are acquired. The single phase change which occurs with such reordering has a minimal effect on the reconstructed image.

Figure 9:
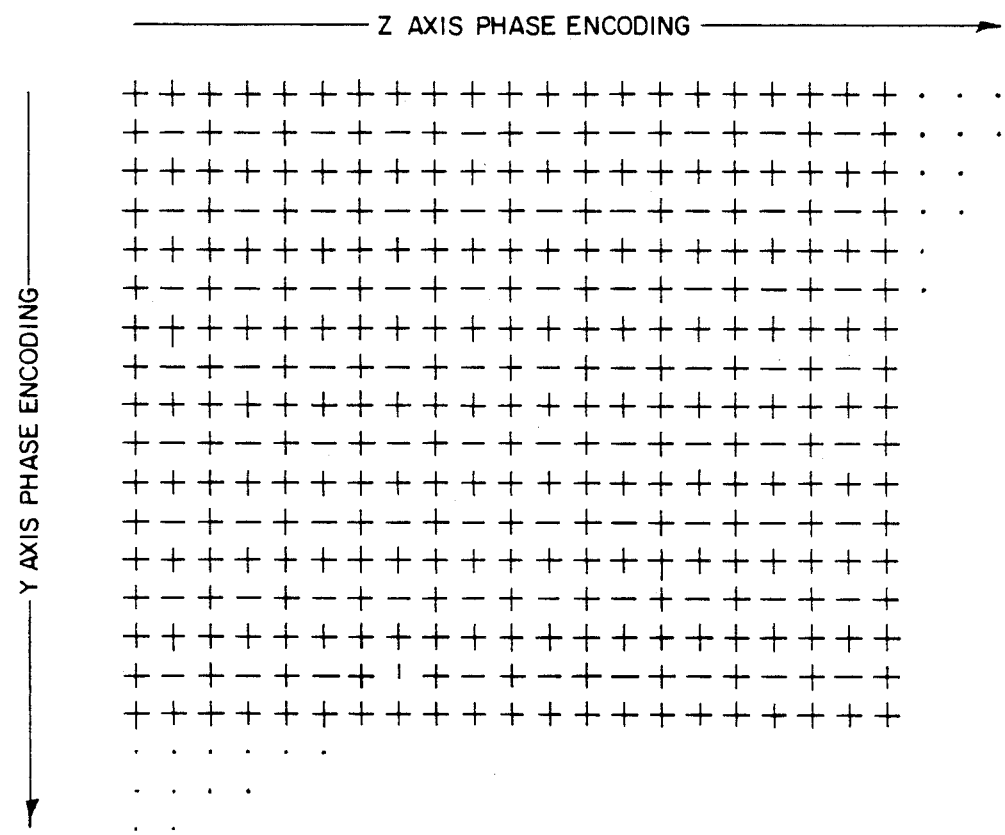
FIG. 9 is a schematic representation of the phase pattern employed with the pulse sequence of FIG. 7 to offset the S+ NMR signal from the S− NMR signal.

An alternative method which may be applied to three-dimensional volume imaging and which also involves the use of a preselected phase pattern for the RF excitation pulses reduces or eliminates interference by the S+ NMR signal without reducing the S− NMR signal. This method is used with the pulse sequence of FIG. 7 in which the phase encoding values along one axis (for example, z) are played out over their entire range for each phase encoding value along the other axis (for example, y). The phase pattern is illustrated in FIG. 9, where each view along the z axis is obtained at each phase encoding value along the y axis. As is shown, for each odd numbered y axis phase encoding value, the phase of the RF excitation pulse in each z axis view is kept the same as in method (1) described above; and for each even numbered y axis phase encoding value, the phase of the RF excitation pulse is alternated between z axis views as in method (2) described above. This sequence is continued for all y axis phase encoding values and a three-dimensional array of NMR data is acquired which is reconstructed into an image.

The three-dimension method of FIG. 9 produces a phase offset in the S+ NMR signal which is acquired with the S— NMR signal. When the image is reconstructed from this acquired data by performing a series of Fourier transformations, the phase offset is manifested as a physical displacement of the S+ and S— images along the y axis by an amount equal to one-half the y axis field of view. The S+ and S— images can thus be separated using a number of techniques. First, oversampling can be used along the y axis to totally separate the S+ and the S— images. For example, instead of acquiring data at 128 different y axis phase encoding values over a given range of values that provide the desired field of view, data is acquired at an additional 128 intermediate values. The S+ image will appear in one-half of the 256 pixel reconstructed picture, and the S— image will appear in the other half.

Another manner in which the phase offset in the method of FIG. 9 can be employed to separate the S+ image from the S— image, is to collapse the S+ image along the y axis. This is accomplished by eliminating the y axis phase encoding pulse 253 in the pulse sequence of FIG. 7. When the image is reconstructed, the S— image appears because it is phase encoded by the gradient pulse 255, but the S+ image appears as a bright line because it contains no y axis phase encoding. The S+ image can be edited out of the picture leaving the desired S— image Unfortunately, the width of this line is usually more than 1 pixel, because of the discrete nature in which the NMR signal is sampled. As a result, the S+ signal may "bleed" into the desired S— image, making the editing out of the S+ signal difficult. This undesirable effect can be minimized by a subtraction technique, similar to "baseline" subtraction, in which a single plane of NMR data is acquired with the phase encoding pulse 253 turned onto its maximum phase encoding value. This acquired NMR data is subtracted from NMR data acquired without the phase encoding pulse 253 with the result that the intensity of the line of S+ signal is substantially reduced and less bleeding into the S— image occurs.

I claim:

1. In an NMR system for applying a polarizing magnetic field, a plurality of magnetic field gradients and an RF excitation field to a subject located in a region of interest and for receiving NMR signals from the subject and reconstructing an image from such NMR signals, a method for operating the NMR system which includes the execution of a series of steady-state free precession pulse sequences which comprise:

(a) applying a substantially constant and homogeneous polarizing magnetic field to the region of interest during the entire pulse sequence;

(b) applying an RF excitation field pulse to the region of interest;

(c) applying a phase encoding magnetic field gradient pulse to the region of interest;

(d) applying a readout magnetic field gradient pulse to the region of interest, the readout magnetic field gradient pulse having a central lobe of one polarity and leading and lagging lobes of the opposite polarity disposed to the respective leading and lagging sides of the central lobe, the magnitude of the lagging lobe being selected to produce a peak in the NMR signal during the application of the central lobe of the readout magnetic field gradient pulse during the next pulse sequence, and the magnitude of the leading lobe being selected to minimize the first moment of the readout magnetic field gradient pulse; and (e) acquiring an NMR signal during the production of the central lobe of the readout magnetic field gradient pulse;

wherein the NMR signals acquired during the series of pulse sequences are employed to reconstruct an image of the subject in the region of interest.

2. The method as recited in claim 1 in which the readout magnetic field gradient pulse is substantially symmetrical about the center of the central lobe.

3. The method as recited in claim 1 in which a crusher magnetic field gradient pulse is applied to the region of interest after the application of the RF excitation field pulse and prior to the application of the readout magnetic field gradient pulse.

4. The method as recited in claim 3 in which a dipolar flow compensation magnetic field gradient pulse is applied to the region of interest after the application of the readout magnetic field gradient pulse to null the first moment of the crusher pulses produced during successive pulse sequences.

5. The method as recited in claim 1 in which the NMR signal acquired during each pulse sequence has an S+ component and an S— component and the phase of the RF excitation pulses in successive pulse sequences in said series is altered in a predetermined pattern such that the intensity of the image reconstructed from the S+ components is reduced relative to the intensity of the image reconstructed from the S— component.

6. The method as recited in claim 5 in which the predetermined pattern is a 180° phase shift in successive pairs of RF excitation pulses in the series.

7. The method as recited in claim 1 in which the NMR signal acquired during each pulse sequence has an S+ component and an S— component and the phase of the RF excitation pulses in successive pulse sequences in said series is altered in a predetermined pattern such that the image which is reconstructed from the S+ component is offset from the image which is reconstructed from the S— component.

8. The method as recited in claim 7 in which each pulse sequence includes the application of a second phase encoding magnetic field gradient pulse to the region of interest to phase encode the S— component of the NMR signal for position along an axis and the series of pulse sequences includes a plurality of sets of pulse sequences in which the magnitude of the second phase encoding magnetic field gradient pulse is set to a fixed value during each set and is incremented by a discrete amount between successive sets, and in which the predetermined pattern is a 180° phase shift in successive RF excitation pulses in alternate sets of RF excitation pulses.

* * * * *